US012273122B2

(12) United States Patent
Huang (10) Patent No.: US 12,273,122 B2
(45) Date of Patent: Apr. 8, 2025

(54) TIME-INTERLEAVED ANALOG TO DIGITAL CONVERTER HAVING ASYNCHRONOUS CONTROL

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 202 days.

(21) Appl. No.: 18/129,109

(22) Filed: Mar. 31, 2023

(65) Prior Publication Data

US 2024/0113723 A1    Apr. 4, 2024

(30) Foreign Application Priority Data

Sep. 29, 2022  (TW) .................................. 111137116

(51) Int. Cl.
*H03M 1/12* (2006.01)
*H03M 1/06* (2006.01)

(52) U.S. Cl.
CPC ....... *H03M 1/1245* (2013.01); *H03M 1/0668* (2013.01)

(58) Field of Classification Search
CPC ..................... H03M 1/1245; H03M 1/0668
USPC .................................................. 341/155, 172
See application file for complete search history.

(56) References Cited

U.S. PATENT DOCUMENTS

| 5,990,815 | A | 11/1999 | Linder et al. |
| 10,763,875 | B2 | 9/2020 | Huang et al. |
| 10,778,242 | B2 | 9/2020 | Huang |
| 10,790,843 | B2 | 9/2020 | Huang |
| 11,239,853 | B1 | 2/2022 | Dai et al. |
| 2021/0250040 | A1 | 8/2021 | Jang et al. |

OTHER PUBLICATIONS

TW 111137115 (Filing date: Sep. 29, 2022 (YYYY-MM-DD)). [Note. unpublished application] "Time-Interleaved Analog to Digital Converter Based on Flash Analog to Digital Conversion".
U.S. Appl. No. 17/870,983, (filed Jul. 22, 2022 (YYYY-MM-DD)). [Note. unpublished application] "Time Interleaved Analog to Digital Converter".

*Primary Examiner* — Peguy Jean Pierre
(74) *Attorney, Agent, or Firm* — WPAT, PC (57) ABSTRACT

A time-interleaved analog to digital converter includes first and second capacitor array circuits, first and second transfer circuits, a fine converter circuitry, and an encoder circuit. The capacitor array circuits sample an input signal and generate first residues according to first quantization signals. The first and second transfer circuits transfer first and second residues respectively. The fine converter circuitry performs a noise shaping signal conversion on the first and second residues to generate a second quantization signal. A turn-on time of the corresponding first transfer circuit is determined based on the coarse conversion corresponding to a first capacitor array circuit and the noise shaping signal conversion corresponding to a second capacitor array circuit to selectively bring forward a start time of the noise shaping signal conversion. The encoder circuit generates a digital output according to the first and the second quantization signals.

20 Claims, 7 Drawing Sheets

TIME-INTERLEAVED ANALOG TO DIGITAL CONVERTER HAVING ASYNCHRONOUS CONTROL

BACKGROUND OF THE INVENTION

1. Field of the Invention

The present disclosure relates to a time-interleaved analog to digital converter, especially to a time-interleaved analog to digital converter having noise shaping function and asynchronous control mechanism.

2. Description of Related Art

Analog to digital converter(s) is/are widely utilized in various electronic devices to convert an analog signal to a corresponding digital signal for subsequent signal processing. As the operating speed increases, the operational period for an analog to digital converters to convert signals becomes shorter and shorter. As a result, requirements (e.g., switching speed, power consumption, etc.) of some circuits (e.g., sampling circuit, comparator circuit, etc.) of analog to digital converter are getting higher, which makes it more difficult to implement analog to digital converter circuits suitable for high-speed applications.

SUMMARY OF THE INVENTION

In some aspects of the present disclosure, an object of the present disclosure is, but not limited to, provide a time-interleaved analog to digital converter having an asynchronous control mechanism, so as to make an improvement to the prior art.

In some aspects of the present disclosure, a time-interleaved analog to digital converter includes a plurality of capacitor array circuits, a plurality of first transfer circuits, a fine converter circuitry, a plurality of second transfer circuits, and an encoder circuit. The plurality of capacitor array circuits are configured to sequentially sample an input signal and generate a plurality of first residue signals according to a plurality of first quantization signals, in which the plurality of first quantization signals are generated based on a coarse analog to digital conversion performed based on the input signal. The plurality of first transfer circuits are configured to be turned on according to a plurality of first control signals, in order to sequentially transfer the plurality of first residue signals from the plurality of capacitor array circuits. The fine converter circuitry is configured to perform a noise shaping signal conversion according to a first signal in the plurality of first residue signals and a second signal in a plurality of second residue signals, in order to generate a second quantization signal, in which a turn-on time of a first one of the plurality of first transfer circuit is determined based on the coarse analog to digital conversion corresponding to a first capacitor array circuit in the plurality of capacitor array circuits and the noise shaping signal conversion corresponding to a second capacitor array circuit in the plurality of capacitor array circuits, in order to selectively bring forward a start time of the noise shaping signal conversion. The plurality of second transfer circuits are configured to sequentially transfer the plurality of second residue signals from the plurality of capacitor array circuits to the fine converter circuitry according to a plurality of second control signals. The encoder circuit is configured to generate a digital output according to the second quantization signal and a corresponding one of the plurality of first quantization signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may be a single system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

In some embodiments, implementations of certain circuits may be understood with reference to related circuits in a first literature (U.S. Pat. No. 10,763,875), a second literature (U.S. Pat. No. 10,778,242) and a third literature (U.S. Pat. No. 10,790,843), but the implementations of those circuits are not limited thereto. These literatures are incorporated by reference herein in their entirety and for all purposes.

Figure 1A:
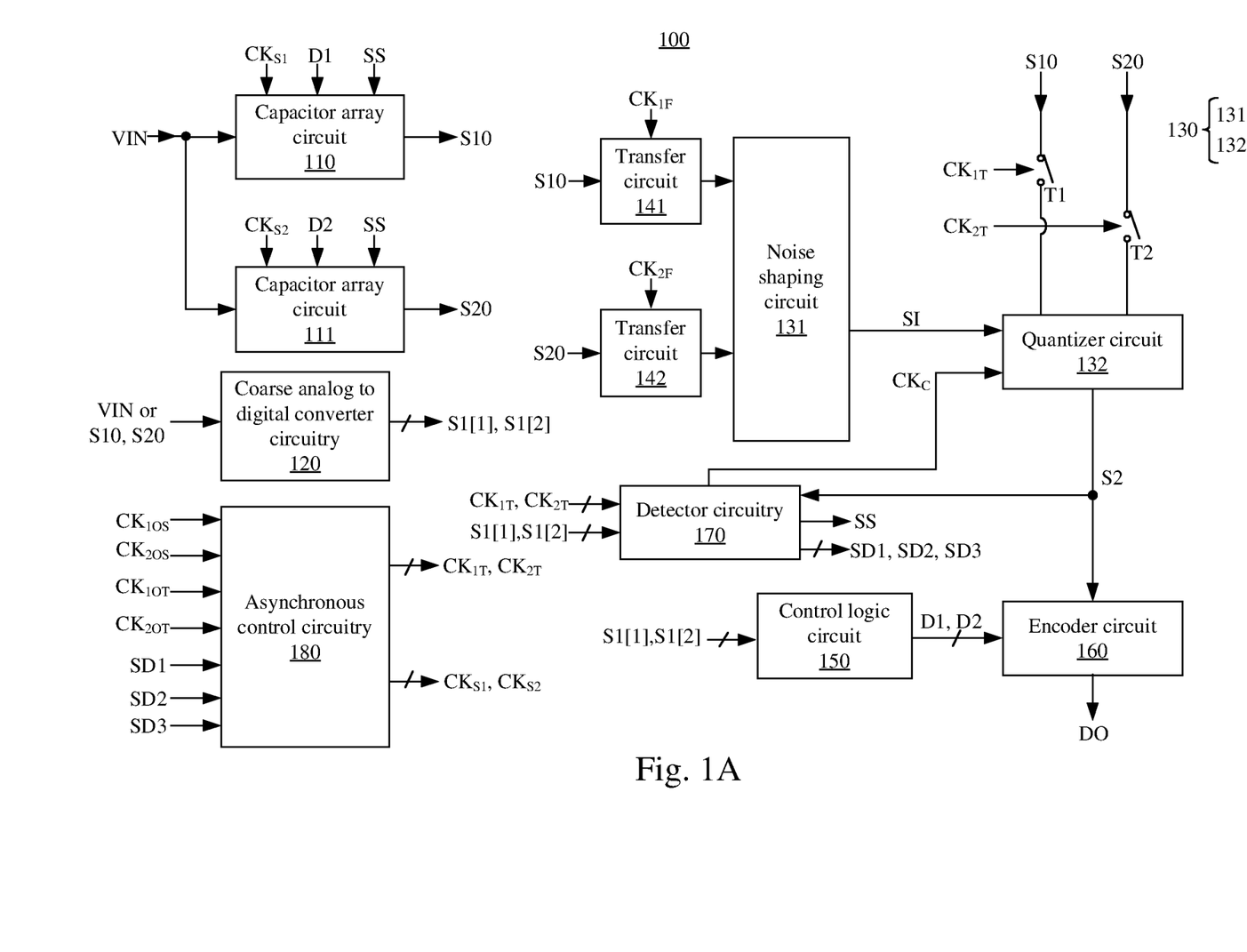
FIG. 1A illustrates a schematic diagram of a time-interleaved analog to digital converter according to some embodiments of the present disclosure.

FIG. 1A illustrates a schematic diagram of a time-interleaved analog to digital converter 100 according to some embodiments of the present disclosure. The time-interleaved analog to digital converter 100 includes capacitor array circuits 110-111, a coarse analog to digital converter circuitry 120, a fine converter circuitry 130, transfer circuits T1-T2, transfer circuits 141-142, a control logic circuit 150, an encoder circuit 160, a detector circuitry 170, and an asynchronous control circuitry 180.

The capacitor array circuits 110-111 sequentially sample an input signal VIN according to control signals $CK_{S1}$ and $CK_{S2}$, and generate signals S10 and S20 according to quantization signals S1[1] and S1[2]. For example, the capacitor array circuit 110 samples the input signal VIN according to the control signal $CK_{S1}$, and is switched according to a digital code D1 (which is generated based on the quantization signal S1[1]) to generate the signal S10. Similarly, the capacitor array circuit 111 samples the input signal VIN according to the control signal $CK_{S2}$, and is switched according to a digital code D2 (which is generated based on the quantization signal S1[2]) to generate the signal S20.

In some embodiments, implementations of each of the capacitor array circuits 110 and 111 may be understood with reference to the capacitor C1 in the first literature or the capacitor array circuit CT1 in the second literature or the third literature, but the present disclosure is not limited to thereto. In some embodiments, each of the signals S10 and S20 may be a signal on the node N1 in the first literature, the second literature, and/or the third literature, but the present disclosure is not limited thereto. Arrangements about the capacitor array circuits 110 and 111 are described with reference to FIG. 2.

For ease of understanding, the signal S10 that is generated after the capacitor array circuit 110 is switched by the digital code D1 and the signal S20 that is generated after the capacitor array circuit 111 is switched by the digital code D2 are referred to as "first residue signals." Moreover, the signal S10 and the signal 20 that are generated by the capacitor array circuit 110 and the capacitor array circuit 111 in response to a noise shaping signal conversion performed by the fine converter circuitry 130 are referred to as "second residue signals."

The coarse analog to digital converter circuitry 120 may perform a coarse analog to digital conversion (which is reference to as "coarse conversion" hereinafter) based on the input signal VIN (or the signals S10 and S20) to generate the quantization signals S1[1] and S1[2]. In different embodiments, the coarse analog to digital converter circuitry 120 may include, but not limited to, a successive approximation register (SAR) analog to digital conversion or a flash analog to digital conversion, but the present disclosure is not limited thereto. For example, if the coarse conversion is a SAR analog to digital conversion, the coarse analog to digital converter circuitry 120 may include quantizer circuits (not shown), which may generate the quantization signal S1[1] and S1[2] respectively according to the signal S10 and the signal S20. Under this condition, the control logic circuit 150 may perform a SAR algorithm according to a corresponding one of the quantization signals S1[1] and S1[2], in order to generate a corresponding one of the digital codes D1 and D2. Alternatively, if the coarse conversion is the flash analog to digital conversion, the coarse analog to digital converter circuitry 120 may include quantizer circuits (not shown), which may sample the input signal VIN, and compare the sampled input signal VIN with different reference voltages respectively to generate the quantization signals S1[1] and S1[2]. Under this condition, the control logic circuit 150 may perform codec, redundant computation, and/or error correction operation(s) according to a corresponding one of the quantization signals S1[1] and S1[2], in order to generate a corresponding one of the digital codes D1 and D2. In some embodiments, the control logic circuit 150 may be implemented with one or more digital circuits that perform the corresponding operation(s).

In some embodiments, a sampling time for the coarse analog to digital converter circuitry 120 to sample the input signal VIN is equal to a sampling time for the capacitor array circuit 110 or the capacitor array circuit 111 to sample the input signal VIN. When the coarse analog to digital converter circuitry 120 and the capacitor array circuit 110 sample the input signal VIN concurrently (or sample the input signal VIN in the same phase), the coarse conversion that is performed according to the sampled input signal VIN corresponds to the capacitor array circuit 110. Similarly, when the coarse analog to digital converter circuitry 120 and the capacitor array circuit 111 sample the input signal VIN (or sample the input signal VIN in the same phase), the coarse conversion that is performed according to the sampled input signal VIN corresponds to the capacitor array circuit 111.

The transfer circuits T1 and T2 sequentially transfer the signals S10 and S20 (i.e., the first residue signals) from the capacitor array circuits 110 and 111 to the fine converter circuitry 130 according to control signals $CK_{1T}$ and $CK_{2T}$. In greater detail, after a corresponding one of the quantization signals S1[1] and S1[2] is generated, each of the transfer circuits T1 and T2 transfers a corresponding signal S10 or S20 from a corresponding capacitor array circuit 110 or 111 to the fine converter circuitry 130 according to a corresponding one of the control signals $CK_{1T}$ and $CK_{2T}$. For example, after the quantization signal S1[1] is generated, the transfer circuit T1 is turned on according to the control signal $CK_{1T}$, in order to output a residue voltage of the capacitor array circuit 110 (i.e., the signal S10 at that moment) to be one of the first residue signals. With this analogy, it is able to understand a relation among the signal S20, the quantization signal S1[2], and the transfer circuit T2. In some embodiments, each of the transfer circuits T1-T2 may be implemented with switch circuits, but the present disclosure is not limited thereto.

The fine converter circuitry 130 performs the noise shaping signal conversion on a first signal of the first residue signals and a second signal of the second residue signals according to the conversion control signal $CK_C$, in order to the quantization signal S2. In greater detail, the fine converter circuitry 130 may perform the noise shaping signal conversion according to the aforementioned first and second signals during a predetermined period of the conversion control signal $CK_C$ (for example, but not limited to, a period with a low level) to generate the quantization signal S2. Alternatively, the fine converter circuitry 130 may be reset (e.g., the quantization signal S2 is reset to a predetermined level) during a reset period of the conversion control signal $CK_C$ (for example, but not limited to, a period when the conversion control signal $CK_C$ has a high level.

In some embodiments, the capacitor array circuits 110 and 111 further generate the second residue signals (e.g., the signal S10 or S20 at that moment) in response to the noise shaping signal conversion. As mentioned above, when the transfer circuit T1 transfers the signal S10 to the fine converter circuitry 130, the fine converter circuitry 130 may perform the noise shaping signal conversion. After the noise shaping signal conversion is performed, the signal S10 of the capacitor array circuit 110 (i.e., the residue voltage on the capacitor array circuit 110 at this moment) is one of the second residue signals. Alternatively, when the transfer circuit T2 transfers the signal S20 to the fine converter circuitry 130, the fine converter circuitry 130 may perform the noise shaping signal conversion. After this noise shaping signal conversion is performed, the signal S20 of the capacitor array circuit 111 (i.e., the residue voltage on the capacitor array circuit 111 at this moment) is one of the second residue signals.

The transfer circuits 141 and 142 sequentially transfer the second residue signals from the capacitor array circuits 110 and 111 to the fine converter circuitry 130 according to control signals $CK_{1F}$ and $CK_{2F}$. As mentioned above, the second residue signals are signals respectively generated from the capacitor array circuits 110 and 111 in response to the noise shaping signal conversion. In other words, after the noise shaping signal conversion is performed, the residue voltage on one of the capacitor array circuits 110 and 111 (i.e., a corresponding one the signals S10 and S20) is a corresponding one of the second residue signals. For example, after the fine converter circuitry 130 completes the noise shaping signal conversion (which is performed following to the generation of the quantization signal S1[1]), the transfer circuit 141 may be turned on according to the control signal $CK_{1F}$, in order to transfer the signal S10 from the capacitor array circuit 110 to be a corresponding one of the second residue signals. Alternatively, after the fine converter circuitry 130 completes the noise shaping signal conversion (which is performed following to the generation of the quantization signal S1[2]), the transfer circuit 142 may be turned on according to the control signal $CK_{2F}$, in order to transfer the signal S20 from the capacitor array circuit 111 to be a corresponding one of the second residue signals. In some embodiments, each of the transfer circuits 141 and 142 may be implemented with a switch circuit, but the present disclosure is not limited thereto.

The fine converter circuitry 130 may process one of the second residue signals (i.e., the second signal), and perform a quantization according to the processed result (i.e., a signal SI) and the first signal to generate the quantization signal S2. In some embodiments, the fine converter circuitry 130 includes a noise shaping circuit 131 and a quantizer circuit 132. The noise shaping circuit 131 is coupled to the transfer circuits 141 and 142 to sequentially receive the second residue signals, and processes the second signal of the second residue signals to generate the signal SI. The quantizer circuit 132 may sequentially receive the first residue signals from the transfer circuits T1-T2, and perform the quantization according to the signal SI and the first signal of the first residue signals to generate the quantization signal S2. In this embodiment, the quantizer circuit 132 may be a comparator circuit having more than two input terminals (not shown). For example, the comparator circuit may include two input pairs (which correspond to the aforementioned input terminals), in which one input pair receives the first signal, another one input pair receives the signal SI, and the comparator circuit may generate the quantization signal S2 according to a summation of the first signal and the signal SI. In some embodiments, the noise shaping circuit 131 may include an integrator circuit and a circuit portion for storing the second signal. In some embodiments, implementations of the transfer circuits 141-142 may be understood with reference to the capacitors Cex5-Cex6 in FIG. 5A of the third literature, implementations of the noise shaping circuit 131 may be understood with reference to the circuit 120 (or the circuit 122) in FIG. 5A of the third literature, and implementations of the quantizer circuit 132 may be understood with reference to the circuit 140A (or the circuit 140B) in FIG. 5A of the third literature, but the present disclosure is not limited thereto.

In some embodiments, when the aforementioned first signal is from the capacitor array circuit 110, the noise shaping signal conversion performed according to the first signal and the second signal corresponds to the capacitor array circuit 110. Similarly, when the aforementioned first signal is from the capacitor array circuit 111, the noise shaping signal conversion performed according to the first signal and the second signal corresponds to the capacitor array circuit 111.

The encoder circuit 160 generates a digital output DO according to the quantization signal S2 and a corresponding one of the quantization signals S1[1] and S1[2]. In greater detail, when the quantization signal S2 is generated from a corresponding one of the first residue signals, the encoder circuit 160 may combine a corresponding digital code (which is generated according to the corresponding one of the quantization signals S1[1] and S1[2]) with the quantization signal S2 to be the digital output DO. For example, when the transfer circuit T1 transfers the signal S10 (i.e., the first residue signal at that moment) to the quantizer circuit 132 to generate the quantization signal S2, the encoder circuit 160 may combine the digital code D1 corresponding to the quantization signal S1[1] with the quantization signal S2 to be the digital output DO. Alternatively, when the transfer circuit T2 transfers the signal S20 (i.e., the first residue signal at that moment) to the quantizer circuit 132 to generate the quantization signal S2, the encoder circuit 160 may combine a digital code D2 corresponding to the quantization signal S1[2] with the quantization signal S2 to be the digital output DO. In some embodiments, the encoder circuit 160 may be implemented with digital logic circuit(s).

Figure 4A:
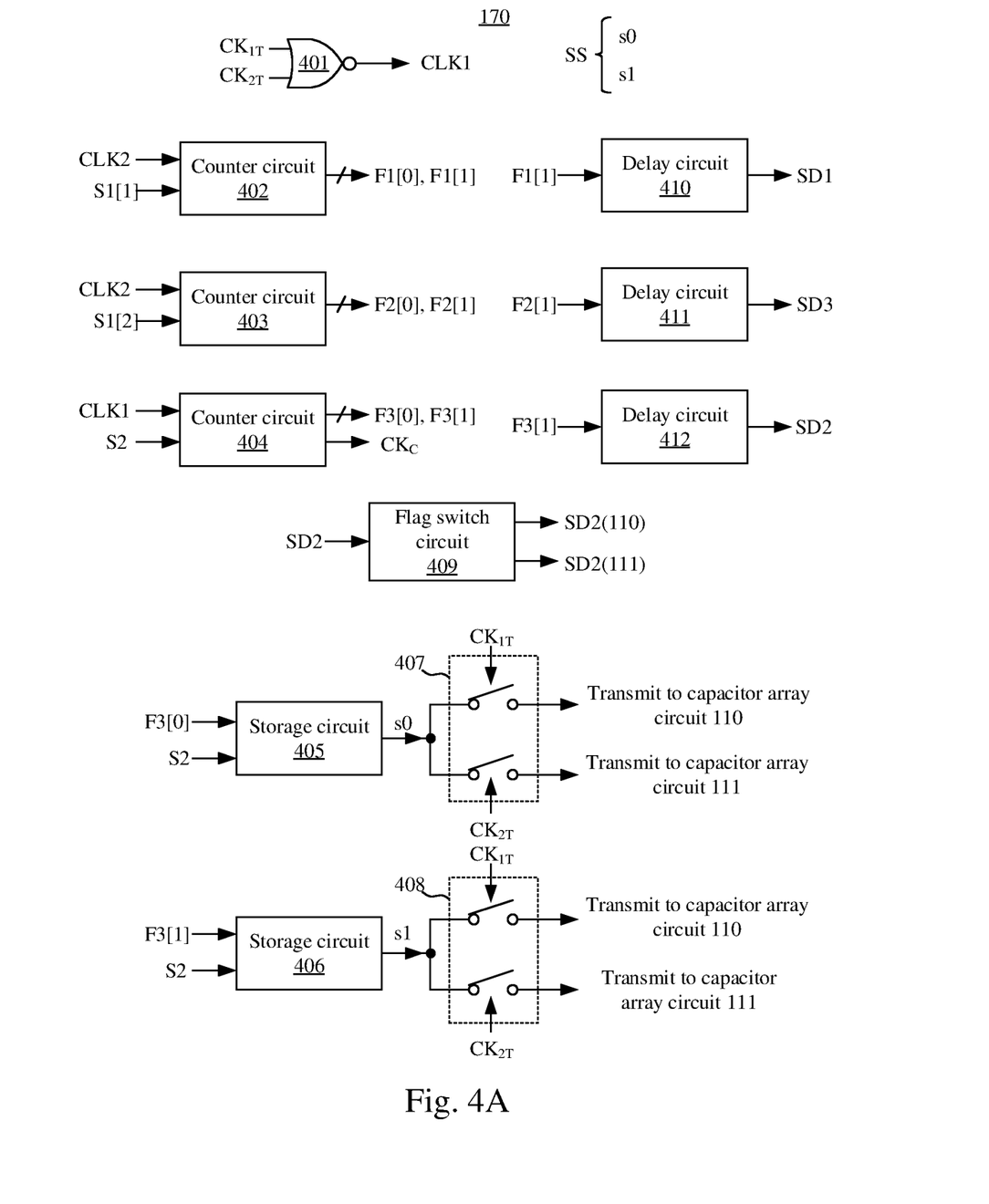
FIG. 4A illustrates a schematic diagram of the detector circuitry in FIG. 1A or FIG. 1B according to some embodiments of the present disclosure.

In some embodiments, the detector circuitry 170 is configured to count according to the quantization signal S1[1] (i.e., a specific signal corresponding to the capacitor array circuit 110) to sequentially generate flag signals F1[0] and F1[1] (as shown in FIG. 4A), count according to the quantization signal S1[2] (i.e., a specific signal corresponding to the capacitor array circuit 111) to generate flag signals F2[0] and F2[1] (as shown in FIG. 4A), and count according to the quantization signal S2 to sequentially generate flag signals F3[0] and F3[1] (as shown in FIG. 4A). The detector circuitry 170 further generates a detection signal SD1 according to a last one of the flag signals F1[0] and F1[1] (e.g., the flag signal F1[1]), generates a detection signal SD3 according to a last one of the flag signals F2[0] and F2[1] (e.g., the flag signal F2[1]), and generates a detection signal SD2 according to a last one of the flag signals F3[0] and F3[1] (e.g., the flag signal F3[1]). The detection signal SD1 may indicate whether the coarse conversion corresponding to the capacitor array circuit 110 is completed, the detection signal SD2 may indicate whether the noise shaping signal conversion corresponding to the capacitor array circuit 110 or 111 is completed, and the detection signal SD3 may indicate whether the coarse conversion corresponding to the capacitor array circuit 111 is completed. In some embodiments, the detector circuitry 170 may output the flag signals F3[0] and F3[1] to be a switching signal SS according to the control signals $CK_{1T}$ and $CK_{2T}$. In some embodiments, the detector circuitry 170 may generate a clock signal (e.g., the clock signal CLK1 in FIG. 4A) according to the control signals $CK_{1T}$ and $CK_{2T}$, and generate the conversion control signal $CK_C$ according to this clock signal, the quantization signal S2, and the last one of the flag signals F3[0] and F3[1]. In some embodiments, the capacitor array circuits 110 and 111 may further adjust the second residues signals according to the switching signal SS. Operations regarding herein will be described with reference to FIG. 2.

In practical application(s), if a wire between the quantizer circuit 132 and other circuits is too long, the load of the quantizer circuit 132 may be too high, which results in a slower processing speed of the quantizer circuit 132. Accordingly, in a layout design, the detector circuitry 170 may be arranged adjacent to the quantizer circuit 132, in order to reduce the length of the wire.

In some embodiments, the asynchronous control circuitry 180 generates the control signal $CK_{1T}$ according to an original control signal $CK_{1OT}$, the detection signal SD1 (which corresponds to the capacitor array circuit 110) and the detection signal SD2 (which corresponds to the capacitor array circuit 111), and generates the control signal $CK_{2T}$ according to a original control signal $CK_{2OT}$, the detection signal SD3 (which corresponds to the capacitor array circuit 111) and the detection signal SD2 (which corresponds to the capacitor array circuit 110). according to the operating state indicated by the detection signal SD1 and the detection signal SD2, the asynchronous control circuitry 180 may determine a turn-on time of the transfer circuit T1 (i.e., adjust the control signal $CK_{1T}$) based on the coarse conversion corresponding to the capacitor array circuit 110 and the noise shaping signal conversion corresponding to the capacitor array circuit 111). Similarly, the asynchronous control circuitry 180 may determine a turn-on time of the transfer circuit T2 (i.e., adjust the control signal $CK_{2T}$) based on the coarse conversion corresponding to the capacitor array circuit 111 and the noise shaping signal conversion corresponding to the capacitor array circuit 110. As a result, during overall operations, a start time of the noise shaping signal conversion is selectively brought forward to improve processing efficiency. Detailed operations regarding herein will be provided with reference to FIG. 3A to FIG. 3C.

In some embodiments, the asynchronous control circuitry 180 further generates the control signal $CK_{S1}$ according to an original control signal $CK_{1OS}$ and the detection signal SD2 (which corresponds to the capacitor array circuit 110), and generate the control signal $CK_{S2}$ according to an original control signal $CK_{2OS}$ and the detection signal SD2 (which corresponds to the capacitor array circuit 111). according to the operating state indicated by the detection signal SD2, the asynchronous control circuitry 180 may determine a sampling time for the capacitor array circuit 110 to sample the input signal VIN (i.e., adjust the control signal $CK_{S1}$) based on the noise shaping signal conversion corresponding to the capacitor array circuit 110. Similarly, the asynchronous control circuitry 180 may determine a sampling time for the capacitor array circuit 111 to sample the input signal VIN (i.e., adjust the control signal $CK_{S2}$) based on the noise shaping signal conversion corresponding to the capacitor array circuit 111. As a result, during an overall operation progress, it is able to selectively bring forward the sampling time for the capacitor array circuits 110 and 111 to sample the input signal VIN. Detailed operations regarding herein will be provided with reference to FIG. 3A to FIG. 3C.

In some related approaches, an analog to digital converter operates with clock signals having fixed timings (e.g., synchronous timing). In general, those clock signals are set to have a longer interval or latency to tolerate impacts from process variations, temperature variations, and/or voltage variations. As a result, the operating speed of the analog to digital converter will be slower. Compared with the above approaches, in some embodiments of the present disclosure, with the asynchronous control circuitry 180, it is able to selectively bring forward the sampling time or the time for performing the noise shaping signal conversion to improve the processing efficiency.

In some embodiments, the asynchronous control circuitry 180 may only generate the control signal $CK_{1T}$ and the control signal $CK_{2T}$. In those embodiments, the control signal $CK_{S1}$ may be replaced with the original control signal $CK_{1OS}$, and the control signal $CK_{S2}$ may be replaced with the original control signal $CK_{2OS}$. In some other embodiments, the asynchronous control circuitry 180 may only generate the control signal $CK_{S1}$ and the control signal $CK_{S2}$. In those embodiments, the control signal $CK_{1T}$ may be replaced with the original control signal $CK_{1OT}$, and the control signal $CK_{S2}$ may be replaced with the original control signal $CK_{2OT}$.

In some embodiments, the operation timing of the time-interleaved analog to digital converter 100 may be understood with reference to FIG. 3 and/or FIG. 5 of a fourth literature (U.S. patent application Ser. No. 17/870,983) which is herein incorporated by reference in its entirety and for all purposes. Taking FIG. 3 of that literature as an example, during the interval T3, if the detector circuitry 170 detects that the coarse conversion (120) and the fine conversion (110) are performed completely, both of the detection signal SD1 and the detection signal SD2 that corresponds to the capacitor array circuit 111 (which corresponds to the capacitor array circuit 121 in that literature) have predetermined logic values (e.g., a logic value of 1). Under this condition, the asynchronous control circuitry 180 may adjust the control signal $CK_{2T}$ according to the detection signal SD3 and the detection signal SD2, in order to bring forward the start time of the fine conversion (110). Similarly, during the interval T3, if the detector circuitry 170 detects that the fine conversion (110) is performed completely, the detection signal SD2 corresponding to the capacitor array circuit 110 has the predetermined logic value (e.g., a logic value of 1). Under this condition, the asynchronous control circuitry 180 may adjust the control signal $CK_{S2}$ according to the detection signal SD2 corresponding to the capacitor array circuit 110, in order to bring forward the start time of the sampling (110). Moreover, the aforementioned first signal may be the signal VRES1 in FIG. 3 and/or FIG. 5 of the fourth literature, and the aforementioned second signal may be the signal VRES2 in FIG. 3 and/or FIG. 5 of the fourth literature.

Figure 1B:
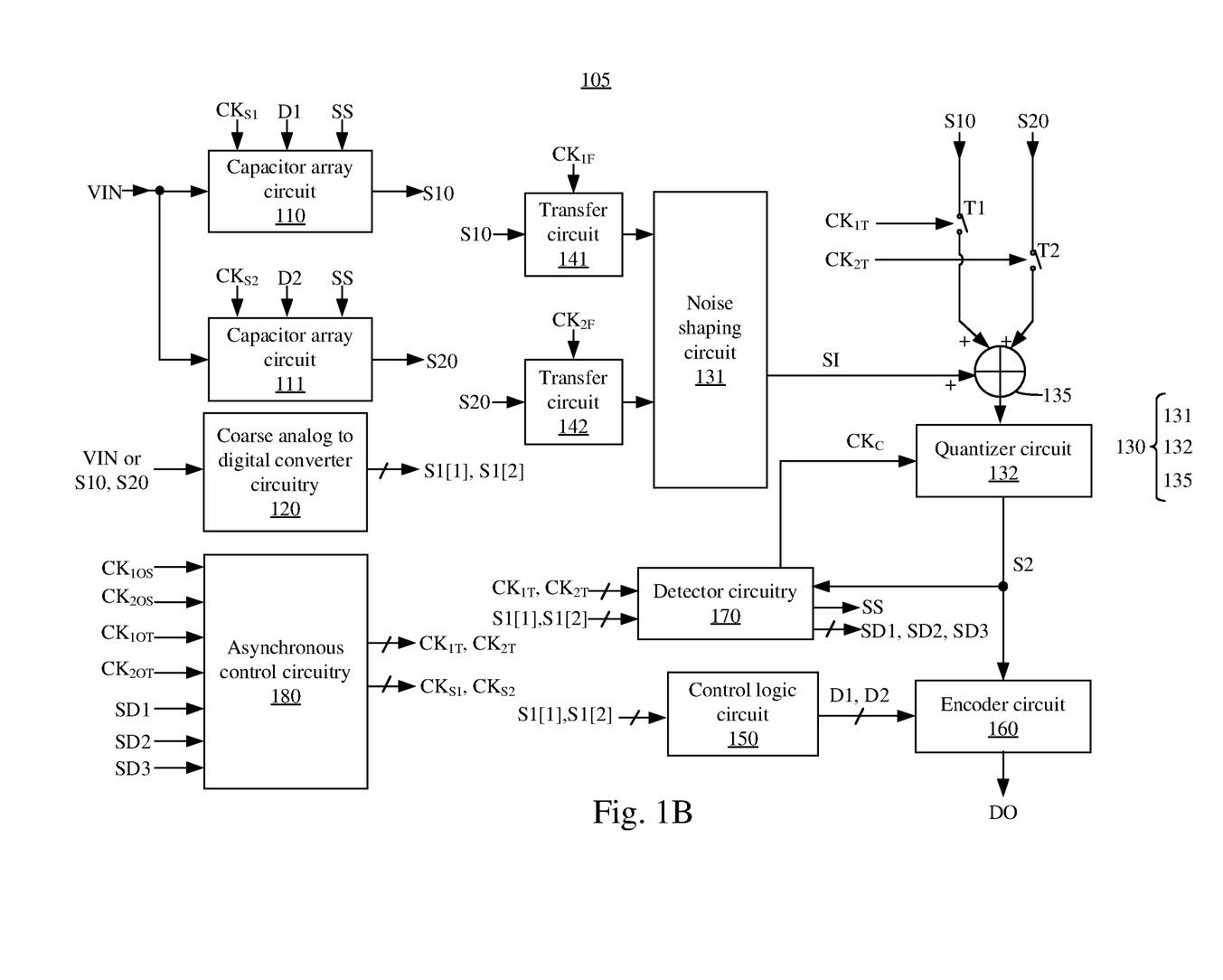
FIG. 1B illustrates a schematic diagram of a time-interleaved analog to digital converter according to some embodiments of the present disclosure.

FIG. 1B illustrates a schematic diagram of a time-interleaved analog to digital converter 105 according to some embodiments of the present disclosure. Compared with the time-interleaved analog to digital converter 100 in FIG. 1A, in the time-interleaved analog to digital converter 105, the fine converter circuitry 130 further includes a summing circuit 135, which may sum up the first residue signal (i.e., a corresponding one of the signals S10 and S20) and the signal SI. In this embodiment, the quantizer circuit 132 may be a comparator circuit having two input terminal, in which one input terminal receive a first input signal, another one input terminal (not shown in FIG. 1B) receives a second input signal, the first input signal and the second input signal have opposite polarities, and the amplitude of each of the first input signal and the second input signal is the summation of the first residue signal and the signal SI (i.e., the first and the second input signals are differential signals). As a result, the quantizer circuit 132 may perform the quantization according to the summation of the first residue signal and the signal SI to generate the quantization signal S2. In some embodiments, the summing circuit 135 may be implemented with a switched capacitor circuit. For example, implementations of the quantizer circuit 132 may be understood with reference to the comparator circuit 220 in the first literature, implementations of the summing circuit 135 may be understood with reference to the switching circuit 120 in the first literature, but the present disclosure is not limited thereto.

Figure 2:
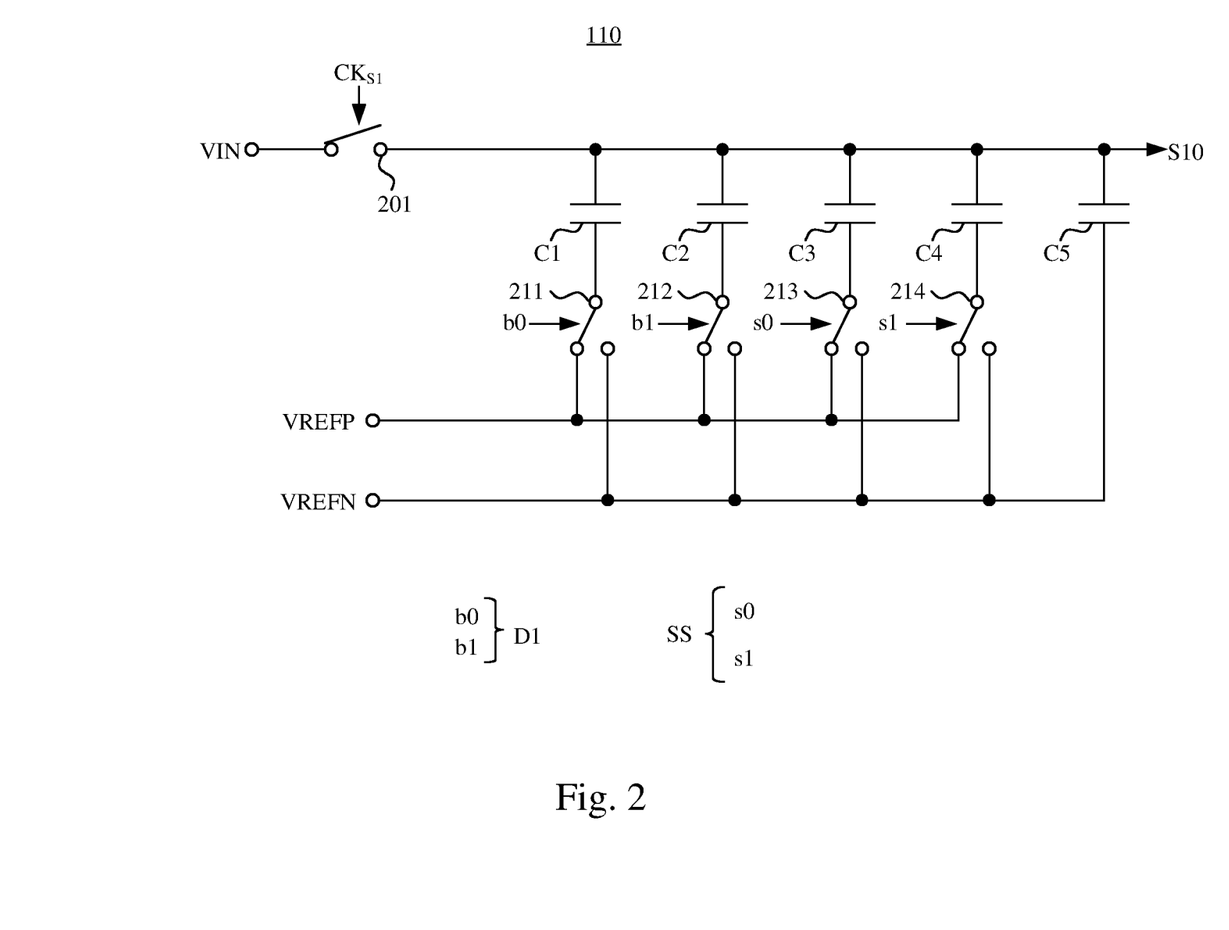
FIG. 2 illustrates a schematic diagram of the capacitor array circuit in FIG. 1A or FIG. 1B according to some embodiments of the present disclosure.

FIG. 2 illustrates a schematic diagram of the capacitor array circuit 110 in FIG. 1A or FIG. 1B according to some embodiments of the present disclosure. The capacitor array circuit 110 includes capacitors C1-C5 and switches 201 and 211-214. The switch 201 is turned on according to the control signal $CK_{S1}$, in order to transmit the input signal VIN to first terminals of the capacitors C1-C5. Under this condition, the capacitors C1-C5 may sample the input signal VIN to generate the signal S10. The switch 211-214 are respectively coupled to second terminals of the capacitors C1-C4, in order to selectively transmit a reference voltage VREFP or a reference voltage VREFN to the second terminals of the capacitors C1-C4, in which the switches 211-212 are controlled by different bits b0-b1 of the digital code D1, and the switches 213-214 are controlled by different bits s0-s1 of the switching signal SS. The second terminal of the capacitor C5 receives the reference voltage VREFN.

In greater detail, taking the switch 211 and the switch 213 as an example, a first terminal of the switch 211 is coupled to the second terminal of the capacitor C1, a second terminal of the switch 211 selectively receives the reference voltage VREFP or the reference voltage VREFN, and a control terminal of the switch 211 receives the bit b0 of the digital code D1. As a result, the switch 211 may selectively transmit the reference voltage VREFP or the reference voltage VREFN to the second terminal of the capacitor C1 according to the bit b0. Similarly, a first terminal of the switch 213 is coupled to the second terminal of the capacitor C3, a second terminal of the switch 213 selectively receives the reference voltage VREFP or the reference voltage VREFN, and the control terminal of the switch 213 receives the bit s0 of the switching signal SS. As a result, the switch 213 may selectively transmit the reference voltage VREFP or the reference voltage VREFN to the second terminal of the capacitor C3. With this analogy, it is able to understand arrangements among the remaining switches, capacitors, and the received bits, and thus the repetitious descriptions are not further given. With the above arrangements, the residue voltage on the capacitor array circuit 110 (e.g., the signal S10) may be refreshed at different times based on the quantization signal S1[1] or the quantization signal S2, in order to generate the corresponding first and second residue signals to perform the noise shaping signal conversion to improve the overall signal-to-noise ratio.

In this example, the capacitance values of the capacitors C1-C5 are set based on a binary code, in which the capacitor C5 is a dummy capacitor. For example, the capacitance value of each of the capacitors C5 and C4 may be set to be a unity capacitor value (i.e., 1C), the capacitance value of the capacitor C3 may be 2 unity capacitor values (i.e., 2C), the capacitance value of the capacitor C2 may be 4 unity capacitor values (i.e., 4C), and the capacitance value of the capacitor C1 may be 8 unity capacitor values (i.e., 8C). The capacitors C1-C2 correspond to most significant bits (which have higher weights), and the capacitors C3-C4 correspond to least significant bits (which have lower weights). In other words, in some embodiments, switches (e.g., the switches 211-212) coupled to capacitors having higher weights (e.g., the capacitors C1-C2) are controlled by the quantization signals S1[1] and S1[2] (which are used to generate the digital code D1), and switches (e.g., the switches 213-214) coupled to capacitors having lower weights (e.g., the capacitors C3-C4) are controlled by the switching signal SS. In different embodiments, a number of bits in each of the digital code D1 and the switching signal SS may be one or more. The arrangements of the capacitor array circuit 111 are the same as those of the capacitor array circuit 110, and the arrangements of the capacitor array circuit 111 may be understood with reference to FIG. 2, and thus the repetitious descriptions are not further given.

The arrangement of the capacitor array circuit 110 are given for illustrative purposes, and the present disclosure is not limited thereto. In other embodiments, the first terminals of the capacitors C1-C4 may be configured to output the signal S10, and the second terminals of the capacitors C1-C4 may selectively receive the input signal VIN, the reference voltage VREFP, or the reference voltage VREFN via the switches 201 and 211-214.

Figure 3A:
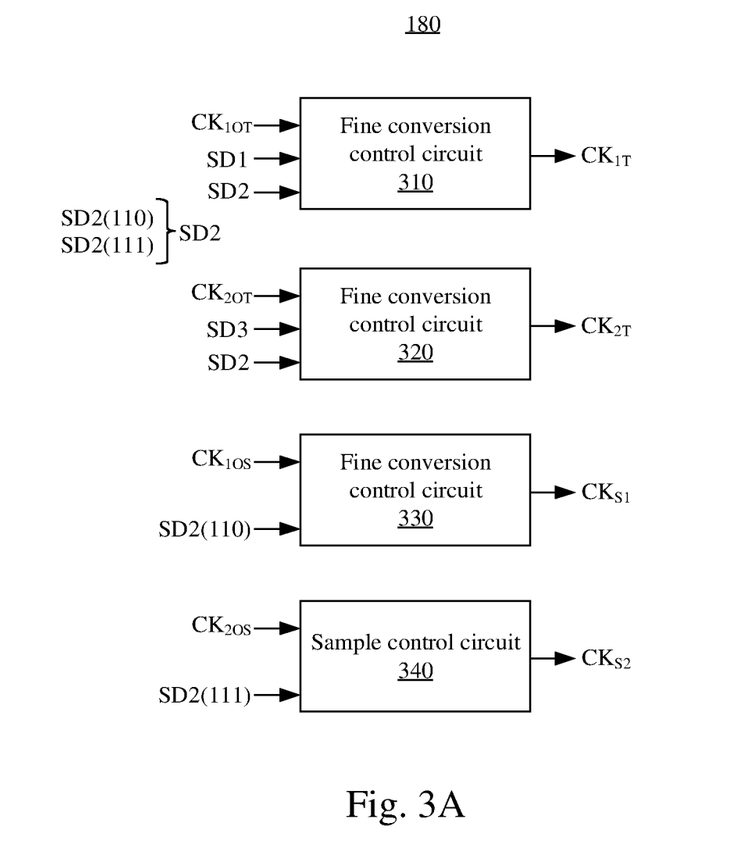
FIG. 3A illustrates a schematic diagram of the asynchronous control circuitry in FIG. 1A or FIG. 1B according to some embodiments of the present disclosure.

FIG. 3A illustrates a schematic diagram of the asynchronous control circuitry 180 in FIG. 1A or FIG. 1B according to some embodiments of the present disclosure. The asynchronous control circuitry 180 includes a fine conversion control circuit 310, a fine conversion control circuit 320, a sample control circuit 330, and a sample control circuit 340.

The fine conversion control circuit 310 is configured to generate the control signal $CK_{1T}$ according to the original control signal $CK_{1OT}$, the detection signal SD1, and the detection signal SD2. The fine conversion control circuit 320 is configured to generate the control signal $CK_{2T}$ according to the original control signal $CK_{2OT}$, the detection signal SD3, and the detection signal SD2. The sample control circuit 330 is configured to generate the control signal $CK_{S1}$ according to the original control signal $CK_{1OS}$ and the detection signal SD2 (which is labeled as SD2(110) as it corresponds to the capacitor array circuit 110). The sample control circuit 340 is configured to generate the control signal $CK_{S2}$ according to the original control signal $CK_{2OS}$ and the detection signal SD2 (which is labeled as SD2(111) as it corresponds to the capacitor array circuit 111).

Figure 3B:
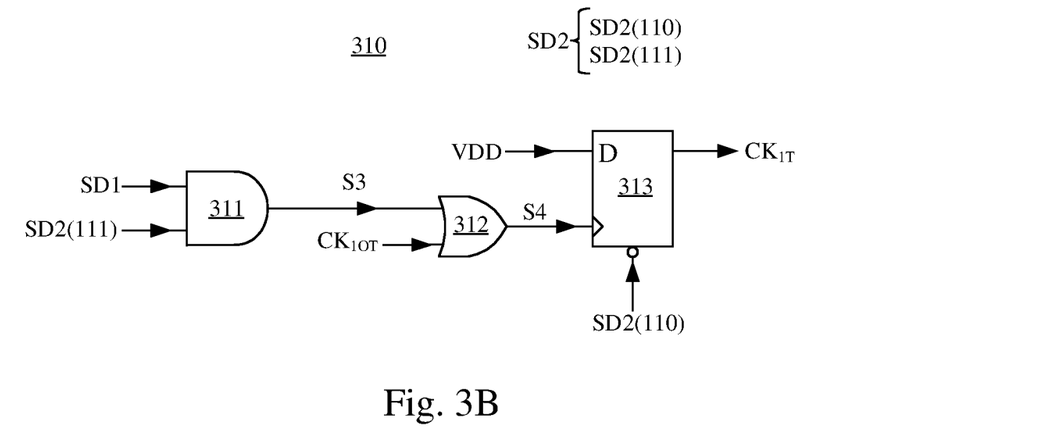
FIG. 3B illustrates a schematic diagram of the fine conversion control circuit in FIG. 3A according to some embodiments of the present disclosure.

FIG. 3B illustrates a schematic diagram of the fine conversion control circuit 310 in FIG. 3A according to some embodiments of the present disclosure. In some embodiments, the fine conversion control circuit 310 includes a logic gate circuit 311, a logic gate circuit 312, and a flip flop circuit 313. The logic gate circuit 311 generates a signal S3 according to the detection signal SD1 and the detection signal SD2(111). In some embodiments, the logic gate circuit 311 may be, but not limited to, an AND gate circuit. When the detection signal SD1 has a logic value of 1, it indicates that the coarse conversion corresponding to the capacitor array circuit 110 is completed. When the detection signal SD2(111) has the logic value of 1, it indicates that the noise shaping signal conversion corresponding to the capacitor array circuit 111 is completed. Accordingly, when both of the detection signal SD1 and the detection signal SD2(111) have the logic values of 1, it indicates that the operations in previous phases are completed. Under this condition, the signal S3 has the logic value of 1 to indicate that a start time of the noise shaping signal conversion corresponding to the capacitor array circuit 110 can be brought forward.

The logic gate circuit 312 generates a signal S4 according to the signal S3 and the original control signal $CK_{1OT}$. In some embodiments, the logic gate circuit 312 may be, but not limited to, an OR gate circuit. The flip flop circuit 313 outputs a voltage VDD to be the control signal $CK_{1T}$ according to the signal S4, and selectively resets the control signal $CK_{1T}$ according to the detection signal SD2(110). In some embodiments, the flip flop circuit 313 may be, but not limited to, a D-type flip flop circuit.

As mentioned above, if the signal S3 has the logic value of 1, the logic gate circuit 312 may output the signal S4 having the logic value of 1, and the flip flop circuit 313 may output the voltage VDD to be the control signal $CK_{1T}$ according to this signal S4. Under this condition, the control signal $CK_{1T}$ has the logic value of 1 to turn on the transfer circuit T1, such that the fine converter circuitry 130 may start performing the noise shaping signal conversion corresponding to the capacitor array circuit 110 in advance. If the coarse conversion corresponding to the capacitor array circuit 110 or the noise shaping signal conversion corresponding to the capacitor array circuit 111 is not completed, the signal S3 has the logic value of 0. Under this condition, if the original control signal $CK_{1OT}$ does not have the logic value of 1, the signal S4 has the logic value of 0. As a result, the flip flop circuit 313 does not output the voltage VDD to be the control signal $CK_{1T}$. In some embodiments, regardless of whether or not the signal S3 has the logic value of 1, when the original control signal $CK_{1OT}$ is switched to the logic value of 1, the logic gate circuit 312 may output the signal S4 having the logic value of 1. In other words, the transition of the original control signal $CK_{1OT}$ (e.g., switch from the logic value of 0 to the logic value of 1) may force the control signal $CK_{1T}$ to be transited, in order to set the latest start time of the noise shaping signal conversion corresponding to the capacitor array circuit 110.

In some embodiments, the fine conversion control circuit 310 and the fine conversion control circuit 320 may have the same circuit architecture, and thus reference is also made to FIG. 3B. For example, in the fine conversion control circuit 320, a logic gate circuit (e.g., the logic gate circuit 311) may generate a signal (corresponding to the signal S3) according to the detection signal SD3 and the detection signal SD2 (110), a logic gate circuit (e.g., the logic gate circuit 312) may generate a signal (corresponding to the signal S4) according to the signal (corresponding to the signal S3) and the original control signal $CK_{2OT}$, and a flip flop circuit (e.g., the flip flop circuit 313) may output the voltage VDD to be the control signal $CK_{2T}$ according to the signal (e.g., the signal S4), and selectively reset the control signal $CK_{2T}$ according to the detection signal SD2(111).

Figure 3C:
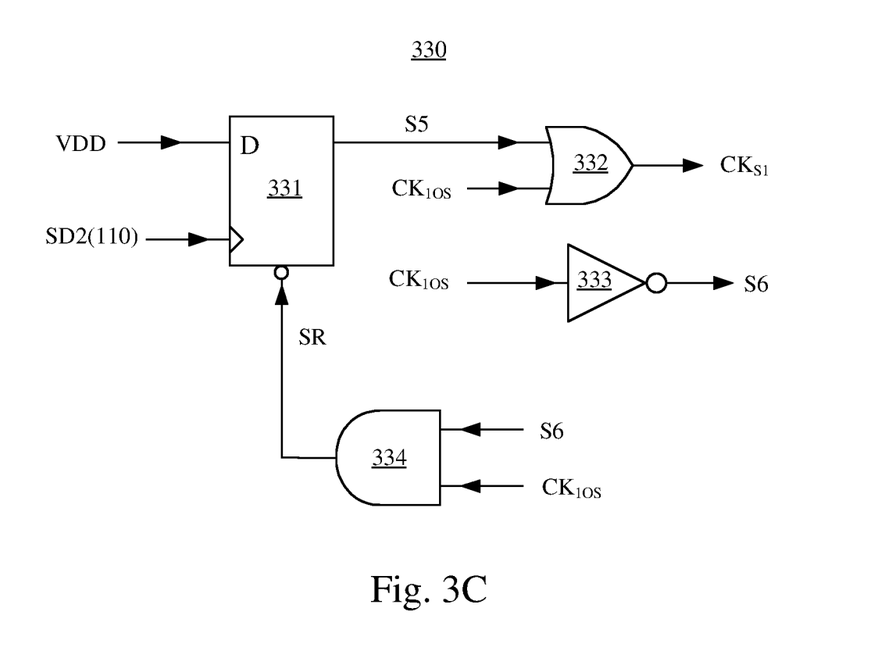
FIG. 3C illustrates a schematic diagram of the sample control circuit in FIG. 3A according to some embodiments of the present disclosure.

FIG. 3C illustrates a schematic diagram of the sample control circuit 330 in FIG. 3A according to some embodiments of the present disclosure. The sample control circuit 330 includes a flip flop circuit 331, a logic gate circuit 332, an inverter circuit 333, and a logic gate circuit 334. The flip flop circuit 331 is configured to output the voltage VDD to be a signal S5 according to the detection signal SD2(110), and reset the signal S5 according to a reset signal SR. In some embodiments, the flip flop circuit 331 may be, but not limited to, a D-type flip flop circuit. The logic gate circuit 332 generates the control signal $CK_{S1}$ according to the signal S5 and the original control signal $CK_{1OS}$. In some embodiments, the logic gate circuit 332 may be, but not limited to, an OR gate circuit. The inverter circuit 333 may be configured to generate a signal S6 according to the original control signal $CK_{1OS}$. The logic gate circuit 334 may be configured to generate the reset signal SR according to the original control signal $CK_{1OS}$ and the signal S6. In some embodiments, the logic gate circuit 334 may be, but not limited to, an AND gate circuit.

In greater detail, when the detection signal SD2(110) has the logic value of 0 (i.e., the noise shaping signal conversion corresponding to the capacitor array circuit 110 is not completed), the flip flop circuit 331 does not output the voltage VDD to be the signal S5. Under this condition, the signal S5 has the logic value of 0, such that the logic gate circuit 332 generates the control signal $CK_{S1}$ according to the original control signal $CK_{1OS}$. When the original control signal $CK_{1OS}$ has the logic value of 1, the logic gate circuit 332 may output the control signal $CK_{S1}$ having the logic value of 1, such that the capacitor array circuit 110 samples the input signal VIN. Alternatively, when the original control signal $CK_{1OS}$ has the logic value of 0, the logic gate circuit 332 outputs the control signal $CK_{S1}$ having the logic value of 0. In other words, similar to the original control signal $CK_{1OT}$ in FIG. 3B, the transition of the original control signal $CK_{1OS}$ may force the control signal $CK_{S1}$ to be transited, in order to set a latest sampling time for the capacitor array circuit 110 to sample the input signal VIN. Alternatively, if the detection signal SD2(110) has the logic value of 1 (i.e., the noise shaping signal conversion corresponding to the capacitor array circuit 110 is completed), the flip flop circuit 331 may output the voltage VDD to be the signal S5. Under this condition, the signal S5 has the logic value of 1, and thus the logic gate circuit 332 outputs the control signal $CK_{S1}$ having the logic value of 1, such that the capacitor array circuit 110 starts sampling the input signal VIN in advance.

On the other hand, when the original control signal $CK_{1OS}$ has the logic value of 0, the inverter circuit 333 outputs the signal S6 having the logic value of 1. Under this condition, the logic gate circuit 334 may output the reset signal SR having the logic value of 0. Under this condition, the flip flop circuit 331 does not reset the signal S5. Afterwards, when the original control signal $CK_{1OS}$ is switched to the logic value of 1 but the inverter circuit 333 continues outputting the signal S6 having the logic value of 1 (due to transmission latency), the logic gate circuit 334 may output the reset signal SR having the logic value of 1, such that the flip flop circuit 331 resets the signal S5 to be the logic value of 0. When the inverter circuit 333 is switched to output the signal S6 having the logic value of 1, the logic gate circuit 334 may output the reset signal SR having the logic value of 0, such that the flip flop circuit 331 does not reset the signal S5. When the original control signal $CK_{1OS}$ is switched to the logic value of 0 but the inverter circuit 333 still continues outputting the signal S6 having the logic value of 0 (due to transmission latency), the logic gate circuit 334 may output the reset signal SR having the logic value of 0, such that the flip flop circuit 331 does not reset the signal S5.

FIG. 4A illustrates a schematic diagram of the detector circuitry 170 in FIG. 1A or FIG. 1B according to some embodiments of the present disclosure. The detector circuitry 170 includes a logic gate circuit 401, counter circuits 402-404, storage circuits 405 and 406, switch circuits 407 and 408, a flag switch circuit 409, and delay circuits 410, 411, and 412.

The logic gate circuit 401 generates the clock signal CLK1 according to the control signal $CK_{1T}$ and the clock signal $CK_{2T}$. In some embodiments, the level of the conversion control signal $CK_C$ is controlled by the clock signal CLK1. In some embodiments, the logic gate circuit 401 may be, but not limited to, a NOR gate circuit. The counter circuit 402 counts according to the clock signal CLK2 and the quantization signal S1[1] (which is a specific signal corresponding to the capacitor array circuit 110), in order to sequentially generate the flag signals F1[0] and F1[1]. The counter circuit 403 counts according to the clock signal CLK2 and the quantization signal S1[2] (which is a specific signal corresponding to the capacitor array circuit 111), in order to sequentially generate the flag signals F2[0] and F2[1]. The counter circuit 404 counts according to the clock signal CLK1 and the quantization signal S2, in order to sequentially generate the flag signals F3[0] and F3[1] and the conversion control signal $CK_C$.

The delay circuit 410 may delay the flag signal F1[1] to generate the detection signal SD1. In some embodiments, the delay circuit 410 may be, but not limited to, a D-type flip flop circuit, which may introduce a predetermined delay to the flag signal F1[1] to generate the detection signal SD1. The predetermined delay may be utilized to assure that the transmission of the first residue signal and/or the switching of the capacitor array circuit 110 are stable. In some embodiments, the flag signal F1[1] may be directly outputted as the detection signal SD1.

Similarly, the delay circuit 411 may delay the flag signal F2[1] to generate the detection signal SD3. In some embodiments, the delay circuit 411 may be, but not limited to, a D-type flip flop circuit, which may introduce a predetermined delay to the flag signal F2[1] to generate the detection signal SD3. This predetermined delay may be used to assure that the transmission of the first residue signal and/or the switching of the capacitor array circuit 111 are stable. In some embodiments, the flag signal F2[1] may be directly outputted as the detection signal SD3.

The delay circuit 412 may delay the flag signal F3[1] to generate the detection signal SD2. In some embodiments, the delay circuit 412 may be, but not limited to, a D-type flip flop circuit, which may introduce a predetermined delay to the flag signal F3[1] to generate the detection signal SD2. This predetermined delay may be used to assure that the transmission of the second residue signals and/or the switching of the capacitor array circuits 110 and 111 are stable. In some embodiments, the flag signal F3[1] may be directly outputted as the detection signal SD2.

The flag switch circuit 409 is configured to determine whether the detection signal SD2 corresponds to the capacitor array circuit 110 or the capacitor array circuit 111. If the detection signal SD2 corresponds to the capacitor array circuit 110, the flag switch circuit 409 may output the detection signal SD2 to be the detection signal SD2(110). Alternatively, if the detection signal SD2 corresponds to the capacitor array circuit 111, the flag switch circuit 409 may output the detection signal SD2 to be the detection signal SD2(111). In some embodiments, the flag switch circuit 409 may include a counter circuit and a multiplexer circuit. The counter circuit may count according to the quantization signal S2 (or may be the control signal $CK_{1F}$ and/or the control signal $CK_{2F}$), in order to generate a count value. Before the time-interleaved analog to digital converter 100 (or 105) is enabled, the count value is zero0. If the count value is an odd number higher than or equal to 1, the multiplexer circuit may output the detection signal SD2 to be the detection signal SD2(110) (i.e., the detection signal SD2 is determined to correspond to the capacitor array circuit 110). Alternatively, if the count value is an even number higher than or equal to 2, the multiplexer circuit may output the detection signal SD2 to be the detection signal SD2(111) (i.e., the detection signal SD2 is determined to correspond to the capacitor array circuit 111).

For example, when the time-interleaved analog to digital converter 100 (or 105) starts operating, the capacitor array circuit 110 may start sampling the input signal VIN for performing subsequent coarse conversion and/or the noise shaping signal conversion. In response to the quantization signal S2 (or the control signal $CK_{1F}$ and/or the control signal $CK_{2F}$), the counter circuit may increase the count value from 0 to 1. Under this condition, it indicates that the noise shaping signal conversion corresponds to the capacitor array circuit 110, and thus the multiplexer circuit may output the detection signal SD2 to be the detection signal SD2(110) corresponding to the capacitor array circuit 110. Afterwards, the capacitor array circuit 111 starts sampling the input signal VIN for performing subsequent coarse conversion and/or the noise shaping signal conversion. In response to the quantization signal S2 (or the control signal $CK_{1F}$ and/or the control signal $CK_{2F}$), the counter circuit may increase the count value from 1 to 2. Under this condition, it indicates that the noise shaping signal conversion corresponds to the capacitor array circuit 111, and thus the multiplexer circuit may output the detection signal SD2 to be the detection signal SD2(111) corresponding to the capacitor array circuit 111. With this analogy, it is able to understand the subsequent operations of the flag switch circuit 409. The above arrangements about the flag switch circuit 409 are given for illustrative purposes, and the present disclosure is not limited thereto. Various arrangements able to implement the same functions are within the contemplated scope of the present disclosure.

Figure 4B:
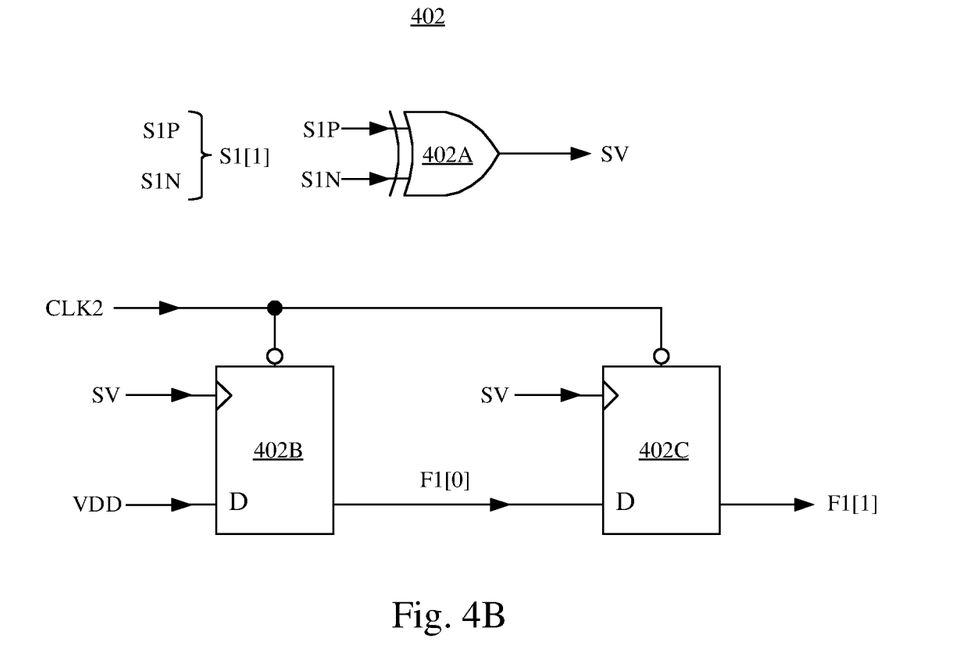
FIG. 4B illustrates a schematic diagram of the counter circuit in FIG. 4A according to some embodiments of the present disclosure.
Figure 4C:
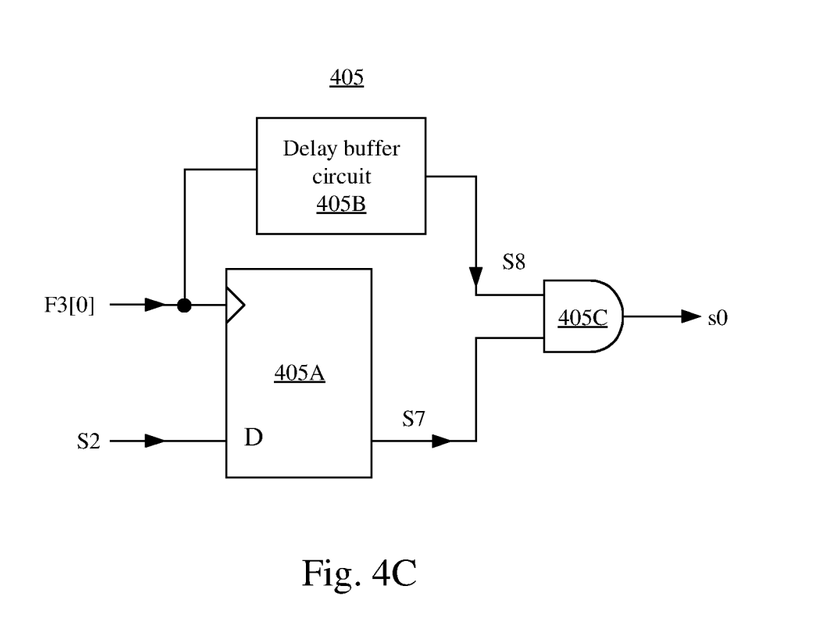
FIG. 4C illustrates a schematic diagram of the storage circuit in FIG. 4A according to some embodiments of the present disclosure.

The storage circuit 405 may output the quantization signal S2 to be a signal S7 (as shown in FIG. 4C) according to the flag signal F3[0], and generate the bit s0 according to a signal S8 (as shown in FIG. 4C) and the signal, in which the signal S8 is a delayed signal of the flag signal F3[0]. Similarly, the storage circuit 406 may output the quantization signal S2 to a be signal according to the flag signal F3[1] and generate the bit S1 according to that signal and a delayed signal of the flag signal F3[1].

The switch circuit 407 includes a first switch and a second switch that are coupled to the storage circuit 405, and transmit the bit s0 to a corresponding one of the capacitor array circuit 110 and the capacitor array circuit 111 according to the control signal $CK_{1T}$ and the control signal $CK_{2T}$. For example, when the control signal $CK_{1T}$ has the high level, the first switch is turned on and the second switch is not turned on, in order to transmit the bit s0 to a switch of the capacitor array circuit 110 (e.g., the switch 213 in FIG. 2). Alternatively, when the control signal $CK_{2T}$ has the high level, the second switch is turned on and the first switch is not turned on, in order to transmit the bit s0 to a switch of the capacitor array circuit 111.

Similarly, the switch circuit 408 includes a third switch and a fourth switch that are coupled to the storage circuit 406, and transmit the bit s1 to a corresponding one of the capacitor array circuit 110 and the capacitor array circuit 111 according to the control signal $CK_{1T}$ and the control signal $CK_{2T}$. For example, when the control signal $CK_{1T}$ has the high level, the third switch is turned on and the fourth switch is not turned on, in order to transmit the bit s1 to a switch of the capacitor array circuit 110 (e.g., the switch 214 in FIG. 2). Alternatively, when the control signal $CK_{2T}$ has the high level, the fourth switch is turned on and the third switch is not turned on, in order to transmit the bit s1 to a switch of the capacitor array circuit 111.

The above arrangements of the switch circuit 407 and the switch circuit 408 are given for illustrative purposes, and the present disclosure is not limited thereto. In different embodiments, more switch circuits and/or more storage circuits may be employed to implement the same operations.

FIG. 4B illustrates a schematic diagram of the counter circuit 402 in FIG. 4A according to some embodiments of the present disclosure. The counter circuit 402 includes a logic gate circuit 402A and flip flop circuits 402B and 402C. The logic gate circuit 402A is configured to detect the quantization signal S1[1] to generate a valid signal SV. In some embodiments, the coarse analog to digital converter circuitry 120 may include a differential comparator circuit having two output terminals (not shown). In other words, in this example, the quantization signal S1[1] may include a signal S1P and a signal S1N (which are differential signals outputted from these output terminals) Levels of these two output terminals may be adjusted by a reset circuit (not shown). For example, the reset circuit may be turned off during a predetermined period and thus does not adjust the levels of these output terminals, and is turned on during a reset period to reset the levels of these output terminals to a predetermined level (i.e., the quantization signal S1[1] is reset to the predetermined level). Accordingly, if the coarse analog to digital converter circuitry 120 is not completed (e.g., the quantization signal S1[1] is not generated), both of the signal S1P and the signal S1N have the predetermined level. Alternatively, if the coarse analog to digital converter circuitry 120 completes to generate the quantization signal S1[1], the signal S1P and the signal S1N have opposite levels (due to being differential signals)). As a result, the logic gate circuit 402A may detect the level of the quantization signal S1[1] (i.e., the signal S1P and the signal S1N) to generate the valid signal SV.

In some embodiments, the logic gate circuit 402A may be, but not limited to, a XOR gate circuit. As a result, when the signal S1P and the signal S1N have different levels, the valid signal SV has the logic value of 1 to indicate that the coarse analog to digital converter circuitry 120 completes the quantization. Alternatively, when the signal S1P and the signal S111 have the same level (e.g., both of them are reset to the predetermined level), the valid signal SV has the logic value of 0 to indicate that the quantization of the coarse analog to digital converter circuitry 120 is not completed. In different embodiments, the logic gate circuit 402A may be implemented with other logic gate circuit(s). For example, the logic gate circuit 402A may be a NAND gate circuit as well.

The flip flop circuits 402B and 402C are coupled in series to form a counter. The flip flop circuits 402B and 402C may be reset according to the clock signal CLK2, and sequentially output the voltage VDD to be the flag signals F1[0] and F1[1] according to the valid signal SV. For example, each of the flip flop circuits 402B and 402C may be a D-type flip flop circuit having an inverting input terminal, in which the inverting input terminal receives the clock signal CLK2 in order to determine whether to reset the flip flop circuits 402B and 402C. When the clock signal CLK2 has the high level, the flip flop circuits 402B and 402C reset the flag signals F1[0] and F1[1] to the logic value of 0. When the clock signal CLK2 has the low level, the flip flop circuits 402B and 402C may sequentially output the voltage VDD to be the flag signals F1[0] and F1[1] according to the valid signal SV. For example, when the clock signal CLK2 has the low level and the valid signal SV has the logic value of 1 for the first time, the flip flop circuit 402B may output the voltage VDD to be the flag signal F1[0] (which is the logic value of 1). Afterwards, when the clock signal CLK2 has the low level and the valid signal SV has the logic value of 1 for the second time, the flip flop circuit 402C may output the flag signal F1[0] to be the flag signal F1[1] (which is the logic value of 1).

In some embodiments, the counter circuit 402 and the counter circuit 403 may have the same circuit arrangement, and thus reference is also made to FIG. 4B. For example, in the counter circuit 403, a logic gate circuit (e.g., the logic gate circuit 402A) is configured to detect the quantization signal S1[2] to generate a valid signal. The flip flop circuits (e.g., the flip flop circuits 402B and 402C) may be reset according to the clock signal CLK2, and may sequentially output the voltage VDD to be the flag signals F2[0] and F2[1] according to the valid signal.

Similarly, the counter circuit 402 and the counter circuit 404 may have the same circuit arrangement, and thus reference is also made to FIG. 4B. For example, in the counter circuit 404, a logic gate circuit (e.g., the logic gate circuit 402A) is configured to detect the quantization signal S2 to generate a valid signal. Flip flop circuits (e.g., the flip flop circuits 402B and 402C) may be reset according to the clock signal CLK1, and sequentially output the voltage VDD to be the flag signals F3[0] and F3[1] according to the valid signal. In some embodiments, the counter circuit 404 may further include a logic gate circuit (which may be, but not limited to, an OR gate circuit), which may generate the conversion control signal $CK_C$ according to the clock signal CLK1, the valid signal generated from the counter circuit 404, and the flag signal F3[1].

As mentioned above, the fine converter circuitry 130 performs the noise shaping signal conversion according to the conversion control signal $CK_C$, and the level of the conversion control signal $CK_C$ is controlled by the clock signal CLK1. When at least one of the control signal $CK_{1T}$ and the control signal $CK_{2T}$ has the high level, the clock signal CLK1 has the low level. Under this condition, if the valid signal SV and the flag signal F3[1] are not the logic value of 1, the conversion control signal $CK_C$ may have the low level, such that the quantizer circuit 132 may perform the quantization to generate the quantization signal S2 during the predetermined period of the conversion control signal $CK_C$ (e.g., a period with the low level). In other words, when one of the transfer circuit T1 and the transfer circuit T2 is turned on during an enabling period of a corresponding one of the control signal $CK_{1T}$ and the control signal $CK_{2T}$ (e.g., a period with the high level) to transfer the first signal, the fine converter circuitry 130 may perform the noise shaping signal conversion during the predetermined period of the conversion control signal $CK_C$ (e.g., a period with the low level).

Alternatively, when both of the control signal $CK_{1T}$ and the control signal $CK_{2T}$ have the low levels, the clock signal CLK1 has the high level. Under this condition, the conversion control signal $CK_C$ has the high level, such that the quantizer circuit 132 may be reset during a reset period of the conversion control signal $CK_C$ (e.g., a period with the high level). In other words, when both of the transfer circuit T1 and the transfer circuit T2 are turned off to not transfer the first signal during a disabling period of the control signal $CK_{1T}$ and that of the control signal $CK_{2T}$ (e.g., a period with the low level), the fine converter circuitry 130 may be reset during a reset period of the conversion control signal $CK_C$ (e.g., a period with the high level).

FIG. 4C illustrates a schematic diagram of the storage circuit 405 in FIG. 4A according to some embodiments of the present disclosure. The storage circuit 405 includes a flip flop circuit 405A, a delay buffer circuit 405B, and a logic gate circuit 405C. The flip flop circuit 405A outputs the quantization signal S2 to be the signal S7 according to the flag signal F3[0]. For example, the flip flop circuit 405A may be a D-type flip flop circuit. The delay buffer circuit 405B may delay the flag signal F3[0] to generate the signal S8. For example, the delay buffer circuit 405B may be a buffer formed with series-coupled inverters, which may delay the flag signal F3[0] to generate the signal S8. The logic gate circuit 405C generate the bit s0 of the switching signal SS according to the signals S7 and S8. For example, the logic gate circuit 405C may be, but not limited to, an AND gate circuit. Arrangements of the storage circuit 406 may be understood with reference to those of the storage circuit 405, and thus the repetitious descriptions are not further given.

In the above embodiments, each of the number of capacitors (or switches) in the capacitor array circuit 110 (or 111) that are controlled by the switching signal SS and the number of capacitors (or switches) in the capacitor array circuit 110 (or 111) that are controlled by the digital code D1 (or D2) is 2. The above component numbers are for illustrative purposes, and the present disclosure is not limited thereto. In different embodiments, each of the number of capacitors (or switches) in the capacitor array circuit 110 (or 111) that are controlled by the switching signal SS and the number of capacitors (or switches) in the capacitor array circuit 110 (or 111) that are controlled by the digital code D1 (or D2) is at least one (or more than two). In other words, the number of bits in each of the switching signal SS and the digital code D1 (or D2) may be at least one (or more than 2). Correspondingly, the number of flip flop circuit(s) in each of the counter circuits 402-404 may be adjusted to one (or more than 2).

As described above, the time-interleaved analog to digital converter may utilize an asynchronous control mechanism to determine whether to bring forward the time for performing the noise shaping signal conversion and/or for sampling the input signal, in order to save overall operation time to improve the processing efficiency.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog to digital converter, comprising:
    a plurality of capacitor array circuits configured to sequentially sample an input signal and generate a plurality of first residue signals according to a plurality of first quantization signals, wherein the plurality of first quantization signals are generated based on a coarse analog to digital conversion performed based on the input signal;
    a plurality of first transfer circuits configured to be turned on according to a plurality of first control signals, in order to sequentially transfer the plurality of first residue signals from the plurality of capacitor array circuits;
    a fine converter circuitry configured to perform a noise shaping signal conversion according to a first signal in the plurality of first residue signals and a second signal in a plurality of second residue signals, in order to generate a second quantization signal, wherein a turn-on time of a first one of the plurality of first transfer circuit is determined based on the coarse analog to digital conversion corresponding to a first capacitor array circuit in the plurality of capacitor array circuits and the noise shaping signal conversion corresponding to a second capacitor array circuit in the plurality of capacitor array circuits, in order to selectively bring forward a start time of the noise shaping signal conversion;
    a plurality of second transfer circuits configured to sequentially transfer the plurality of second residue signals from the plurality of capacitor array circuits to the fine converter circuitry according to a plurality of second control signals; and
    an encoder circuit configured to generate a digital output according to the second quantization signal and a corresponding one of the plurality of first quantization signals.

2. The time-interleaved analog to digital converter of claim 1, further comprising:
    an asynchronous control circuitry configured to generate a corresponding control signal of the plurality of first control signals according to an original control signal, a first detection signal, and a second detection signal, wherein the first detection signal indicates whether the coarse analog to digital conversion corresponding to the first capacitor array circuit is completed, and the second detection signal indicates whether the noise shaping signal conversion corresponding to the second capacitor array circuit is completed.

3. The time-interleaved analog to digital converter of claim 2, wherein the original control signal is configured to set a latest start time of the noise shaping signal conversion corresponding to the first capacitor array circuit.

4. The time-interleaved analog to digital converter of claim 2, wherein the asynchronous control circuitry comprises:
    a first logic gate circuit configured to generate a third signal according to the first detection signal and the second detection signal;
    a second logic gate circuit configured to generate a fourth signal according to the third signal and the original control signal; and a flip flop circuit configured to output a voltage to be the corresponding control signal according to the fourth signal, and selectively reset the corresponding control signal according to the second detection signal that corresponds to the first capacitor array circuit, wherein the first one of the plurality of first transfer circuits is turned on according to the corresponding control signal to transfer the first signal from the first capacitor array circuit to the fine converter circuitry.

5. The time-interleaved analog to digital converter of claim 4, wherein the first logic gate circuit is an AND gate circuit.

6. The time-interleaved analog to digital converter of claim 4, wherein the second logic gate circuit is an OR gate circuit.

7. The time-interleaved analog to digital converter of claim 1, wherein a sampling time for the first capacitor array circuit to sample the input signal is determined based on the noise shaping signal conversion corresponding to the first capacitor array circuit, in order to selectively bring forwards the sampling time for the first capacitor array circuit to sample the input signal.

8. The time-interleaved analog to digital converter of claim 7, further comprising:
an asynchronous control circuitry configured to generate a third control signal according to an original control signal and a detection signal,
wherein the detection signal indicates whether the noise shaping signal conversion corresponding to the first capacitor array circuit is completed, and the first capacitor array circuit samples the input signal according to the third control signal.

9. The time-interleaved analog to digital converter of claim 8, wherein the asynchronous control circuitry comprises:
a flip flop circuit configured to output a voltage to a third signal according to the detection signal and selectively reset the third signal according to a reset signal;
a first logic gate circuit configured to generate the third control signal according to the third signal and the original control signal;
an inverter circuit configured to generate a fourth signal according to the original control signal; and
a second logic gate circuit configured to generate the reset signal according to the original control signal and the fourth signal.

10. The time-interleaved analog to digital converter of claim 9, wherein the first logic gate circuit is an OR gate circuit.

11. The time-interleaved analog to digital converter of claim 9, wherein the second logic gate circuit is an AND gate circuit.

12. The time-interleaved analog to digital converter of claim 8, wherein the original control signal is configured to set a latest sampling time for the first capacitor array circuit to sample the input signal.

13. The time-interleaved analog to digital converter of claim 1, further comprising:

a detector circuitry configured to count according to a specific signal that corresponds to the first capacitor array circuit in the plurality of first quantization signals to sequentially generate a plurality of first flag signals, count according to the second quantization signal to sequentially generate a plurality of second flag signals, generate a first detection signal according to a last one of the plurality of first flag signals, and generate a last one of the plurality of second flag signals to generate a second detection signal,
wherein a turn-on time of the first one of the plurality of first transfer circuits is determined based on the first detection signal and the second detection signal.

14. The time-interleaved analog to digital converter of claim 13, wherein the first detection signal is a delayed signal of the last one of the plurality of first flag signals, and the second detection signal is a delayed signal of the last one of the plurality of second flag signals.

15. The time-interleaved analog to digital converter of claim 13, wherein the detector circuitry comprises:
a first counter circuit configured to count according to a first clock signal and the specific signal, in order to sequentially generate the plurality of first flag signals; and
a second counter circuit configured to count according to a second clock signal and the second quantization signal, in order to sequentially generate the plurality of second flag signals.

16. The time-interleaved analog to digital converter of claim 15, wherein the first counter circuit comprises:
a logic gate circuit configured to generate a valid signal according to the specific signal; and
a plurality flip flop circuits configured to be reset according to the first clock signal and sequentially output a voltage to be the plurality of first flag signals.

17. The time-interleaved analog to digital converter of claim 16, wherein the logic gate circuit is a XOR gate circuit.

18. The time-interleaved analog to digital converter of claim 15, wherein the detector circuitry further comprises:
a logic gate circuit configured to generate the second clock signal according to the plurality of first control signals.

19. The time-interleaved analog to digital converter of claim 18, wherein the logic gate circuit is a NOR gate circuit.

20. The time-interleaved analog to digital converter of claim 1, further comprising:
a detector circuitry configured to count according to the second quantization signal to generate a plurality of flag signals and output a switching signal according to the plurality of flag signals,
wherein the plurality of capacitor array circuits are further configured to adjust the plurality of second residue signals according to the switching signal.

* * * * *